United States Patent
Izawa

(10) Patent No.: US 11,294,222 B2
(45) Date of Patent: Apr. 5, 2022

(54) MANUFACTURING METHOD FOR ELECTRO-OPTICAL DEVICE, ELECTRO-OPTICAL DEVICE, AND ELECTRONIC APPARATUS

(71) Applicant: SEIKO EPSON CORPORATION, Tokyo (JP)

(72) Inventor: Shotaro Izawa, Chitose (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 17/037,704

(22) Filed: Sep. 30, 2020

(65) Prior Publication Data

US 2021/0103184 A1 Apr. 8, 2021

(30) Foreign Application Priority Data

Oct. 8, 2019 (JP) .............................. JP2019-185024

(51) Int. Cl.
*H01L 27/12* (2006.01)
*G02F 1/1335* (2006.01)
*G02F 1/1362* (2006.01)
*G02F 1/1368* (2006.01)

(52) U.S. Cl.
CPC .. *G02F 1/133526* (2013.01); *G02F 1/136286* (2013.01); *H01L 27/1248* (2013.01); *H01L 27/1259* (2013.01); *G02F 1/1368* (2013.01); *G02F 1/13629* (2021.01)

(58) Field of Classification Search
CPC ............. H01L 27/1259; H01L 51/5275; G02F 1/133526; G02B 27/0955
See application file for complete search history.

(56) References Cited

U.S. PATENT DOCUMENTS

| 2004/0012734 A1* | 1/2004 | Yamanaka ........... G02B 3/0056 349/95 |
| 2015/0355502 A1 | 12/2015 | Ozawa |
| 2016/0097883 A1* | 4/2016 | Wakabayashi ....... G02B 3/0068 349/57 |

(Continued)

FOREIGN PATENT DOCUMENTS

| JP | H09269483 | 10/1997 |
| JP | 2007226075 | 9/2007 |

(Continued)

*Primary Examiner* — Mariam Qureshi
(74) *Attorney, Agent, or Firm* — JCIPRNET

(57) ABSTRACT

A manufacturing method of a lens layer, including a first layer and a second layer for an electro-optical device, includes forming a first transmissive layer at a concave surface of an translucency insulating layer, forming, with a different material from the first transmissive layer, a first sacrificial layer on first transmissive layer, polishing its surface, to form a first layer being a residual portion of the first transmissive layer and a sacrificial layer residual portion being a residual portion of the first sacrificial layer, removing the sacrificial layer residual portion, forming a second transmissive layer at the first layer, forming, using a different material from the second transmissive layer, a second sacrificial layer on the second transmissive layer, and polishing the second transmissive layer and the second sacrificial layer to form a second layer from the second transmissive layer.

7 Claims, 11 Drawing Sheets

(56) References Cited

U.S. PATENT DOCUMENTS

| | | | |
|---|---|---|---|
| 2017/0176812 A1 | 6/2017 | Ozawa | |
| 2018/0358397 A1* | 12/2018 | Huang | ............. H01L 27/14685 |
| 2019/0064584 A1 | 2/2019 | Ito | |
| 2020/0274109 A1* | 8/2020 | Kim | ................... H01L 51/0017 |

FOREIGN PATENT DOCUMENTS

| | | |
|---|---|---|
| JP | 2015-230427 | 12/2015 |
| JP | 2016-075796 | 5/2016 |
| JP | 2019-040153 | 3/2019 |

* cited by examiner

MANUFACTURING METHOD FOR ELECTRO-OPTICAL DEVICE, ELECTRO-OPTICAL DEVICE, AND ELECTRONIC APPARATUS

The present application is based on, and claims priority from JP Application Serial Number 2019-185024, filed Oct. 8, 2019, the disclosure of which is hereby incorporated by reference herein in its entirety.

BACKGROUND

1. Technical Field

The present disclosure relates to a manufacturing method for the electro-optical device, an electro-optical device, and an electronic apparatus.

2. Related Art

An electronic apparatus such as a projector generally uses an electro-optical device such as a liquid crystal device configured to change optical characteristics for each of the pixels. For example, an apparatus described in JP 2019-40153 A includes an element substrate provided with a plurality of pixel electrodes and a plurality of switching elements, a counter substrate provided with a common electrode, and a liquid crystal layer disposed between these substrates.

In JP 2019-40153 A, a lens layer is provided between the switching element and the pixel electrode. The lens layer is formed as described below. First, a concave surface is formed at an interlayer insulating film provided over the switching element. Next, a silicon oxynitride film for filling an inside of the concave surface is formed by a chemical vapor deposition (CVD) method. The silicon oxynitride film is then planarized by a chemical mechanical polishing (CMP) method to form the lens layer.

A formation of a lens material layer constituted by a silicon oxynitride film for filling the inside of the concave surface over the concave surface causes a warpage of the substrate to occur due to a residual stress in the lens material layer. Such a warpage brings about an obstacle to a planarization treatment for planarizing the lens material layer, which makes it necessary to suppress the warpage of the substrate. Further, it has been confirmed that such a warpage of the substrate can be mitigated by performing an annealing process on the substrate. However, a provision of the lens layer between the switching element and the pixel electrode prevents the above method from being used. This is because, the switching element and a wiring electrically coupled to the switching elements are provided at a lower layer of the lens layer, which may damage the wiring and the like when performing the annealing process. Moreover, performing the annealing process may cause an adverse effect on a film quality of various types of layers included in the substrate. Thus, there has been a demand for a structure that can suppress the warpage of the substrate without performing the annealing process and a manufacturing method for the structure.

SUMMARY

An aspect of a manufacturing method for an electro-optical device according to the present disclosure is a manufacturing method for an electro-optical device, the electro-optical device including a first substrate including a plurality of pixel electrodes, a second substrate including a common electrode, and an electro-optical layer disposed between the plurality of pixel electrodes and the common electrode, the electro-optical layer having optical characteristics changing according to an electric field, the manufacturing method including, in manufacture of the first substrate or the second substrate, forming a first transmissive layer having translucency at a concave surface of an insulating layer having translucency and having the concave surface, forming, with a material different from a material of the first transmissive layer, a first sacrificial layer at the first transmissive layer, the first sacrificial layer being in contact with the first transmissive layer, polishing the first transmissive layer and the first sacrificial layer to form a first layer from the first transmissive layer and a sacrificial layer residual portion from the first sacrificial layer, removing the sacrificial layer residual portion by etching, forming a second transmissive layer having translucency at the first layer, forming, using a material different from a material of the second transmissive layer, a second sacrificial layer at the second transmissive layer, the second sacrificial layer making contact with the second transmissive layer, and polishing the second transmissive layer and the second sacrificial layer to form a second layer from the second transmissive layer, to thus form a lens layer including the first layer and the second layer.

An aspect of an electro-optical device according to the present disclosure includes a first substrate including a plurality of pixel electrodes, a second substrate including a common electrode, and an electro-optical layer disposed between the plurality of pixel electrodes and the common electrode, the electro-optical layer having optical characteristics changing according to an electric field, the first substrate or the second substrate including an insulating layer having translucency and having a concave surface, and a lens layer having a lens disposed inside the concave surface, the lens layer including a first layer and a second layer, the first layer being disposed between the insulating layer and the second layer.

DESCRIPTION OF EXEMPLARY EMBODIMENTS

Figure 1:
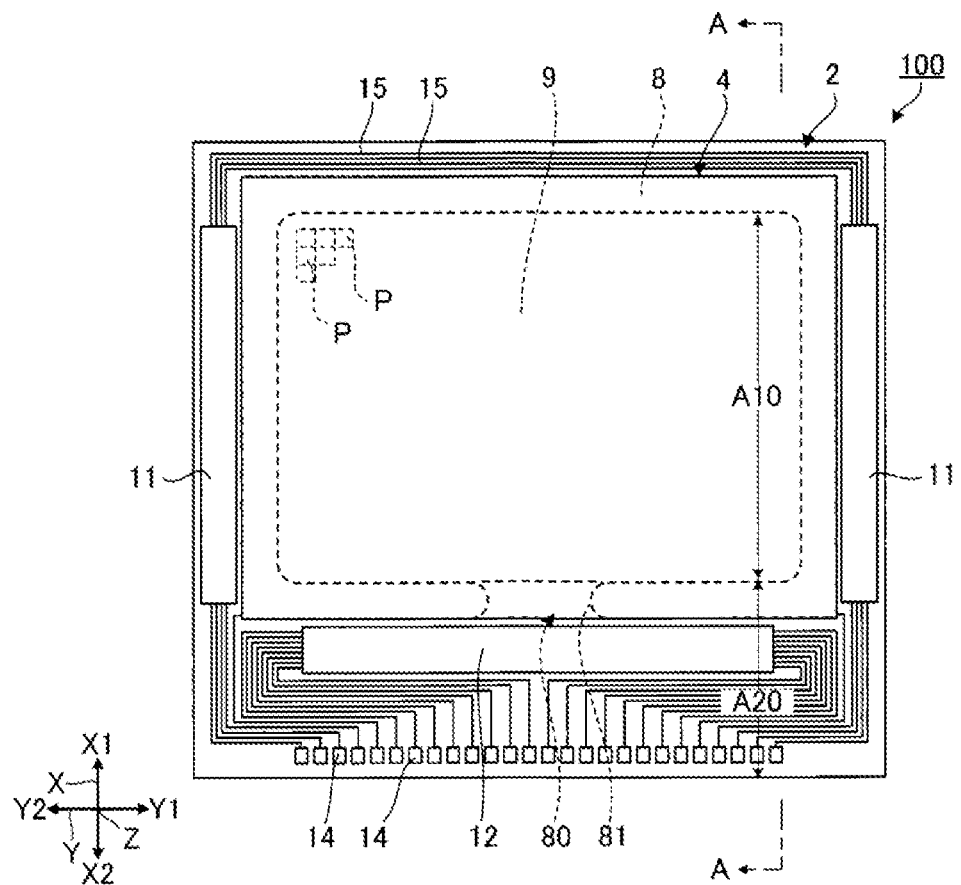
FIG. 1 is a plan view of an electro-optical device according to preferred embodiments.

Preferred embodiments of the present disclosure will be described below with reference to the appended drawings. Note that, in the drawings, dimensions and scales of sections are differed as appropriate from actual dimensions and scales, and some of the sections are schematically illustrated to make them easily recognizable. In addition, the scope of the present disclosure is not limited to these embodiments unless otherwise stated to limit the present disclosure in the following description.

1. Electro-Optical Apparatus

As an example of the electro-optical device of the present disclosure, a liquid crystal device of an active matrix scheme is described as the example.

1-1. Basic Configuration

Figure 2:
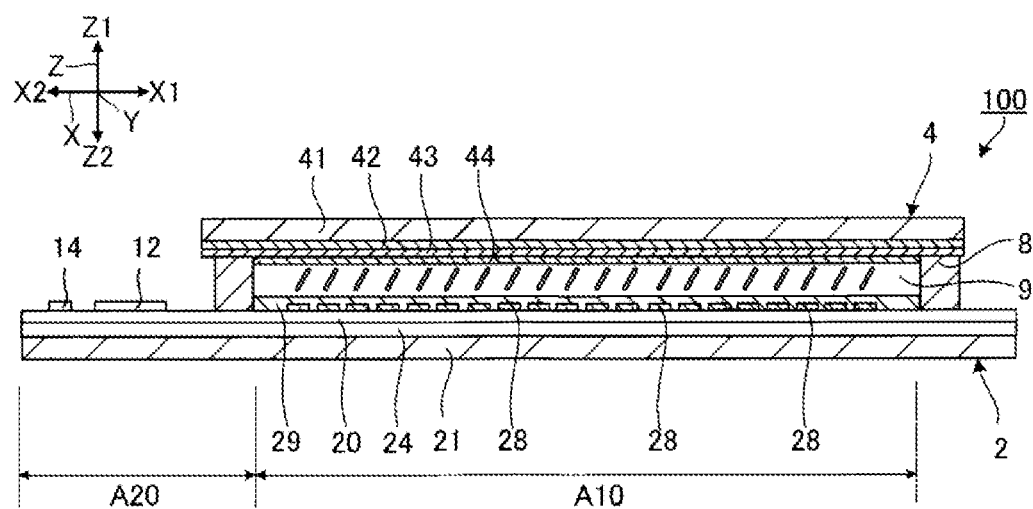
FIG. 2 is a cross-sectional view taken along a line A-A in FIG. 1.

FIG. 1 is a plan view of an electro-optical device 100 according to preferred embodiments. FIG. 2 is a cross-sectional view taken along a line A-A in FIG. 1. Note that, for convenience of explanation, the description will be made below appropriately using an X axis, a Y axis, and a Z axis that are orthogonal to one another. In addition, a direction along the X axis is referred to as "X1 direction", and a direction opposite to the X1 direction is referred to as "X2 direction". Similarly, a direction along the Y axis is referred to as "Y1 direction", and a direction opposite to the Y1 direction is referred to as "Y2 direction". A direction along the Z axis is referred to as "Z1 direction", and a direction opposite to the Z1 direction is referred to as "Z2 direction".

The electro-optical device 100 illustrated in FIGS. 1 and 2 serves as a transmissive-type liquid crystal display apparatus. As illustrated in FIG. 2, the electro-optical device 100 includes an element substrate 2 having translucency, a counter substrate 4 having translucency, a sealing member 8 having a frame shape, and a liquid crystal layer 9. The element substrate 2 exemplifies "first substrate". The counter substrate 4 exemplifies "second substrate". The liquid crystal layer 9 exemplifies "electro-optical layer". The sealing member 8 is disposed between the element substrate 2 and the counter substrate 4. The liquid crystal layer 9 is disposed in a region surrounded by the element substrate 2, the counter substrate 4, and the sealing member 8. The element substrate 2, the liquid crystal layer 9, and the counter substrate 4 are aligned along the Z axis. Hereinafter, viewing in the Z1 direction or the Z2 direction, which coincides with a thickness direction of the counter substrate 4, is referred to as "plan view".

In the electro-optical device 100 of the embodiment, light is incident on the counter substrate 4, passes through the liquid crystal layer 9, and is emitted from the element substrate 2, for example. Note that the light may enter the element substrate 2, pass through the liquid crystal layer 9, and exit from the counter substrate 4. The light serves as visible light. Further, in this specification, "translucency" refers to transparency to visible light, and means that a transmittance of visible light may be not less than 50%. In addition, as illustrated in FIG. 1, the electro-optical device 100 is formed in a quadrilateral shape in a plan view, however, the shape in a plan view of the electro-optical device 100 may be, for example, a round shape and the like, without being limited to the quadrilateral shape.

As illustrated in FIG. 2, the element substrate 2 includes a first base body 21, a wiring layer 24, a light-guiding layer 20, a plurality of pixel electrodes 28, and a first alignment film 29. The first alignment film 29 is located closest to a side of the liquid crystal layer 9 in the element substrate 2, and causes liquid crystal molecules of the liquid crystal layer 9 to be aligned. The materials of the first alignment film 29 include polyimide, silicon oxide, and the like, for example. The element substrate 2 will be described in detail later.

The counter substrate 4 includes a second base body 41, an insulating film 42, a common electrode 43, and a second alignment film 44. The insulating film 42, the common electrode 43, and the second alignment film 44 are aligned in this order from the second base body 41 toward the liquid crystal layer 9. The second base body 41 is constituted by a plate having translucency and insulating properties. The materials of the second base body 41 include glass, quartz, or the like, for example. The insulating film 42 has translucency and insulating properties. The materials of the insulating film 42 include an inorganic material containing silicon, such as silicon oxide and silicon oxynitride, for example. The common electrode 43 is composed of a transparent conductive material such as an indium tin oxide (ITO) or an indium zinc oxide (IZO), for example. The second alignment film 44 is located closest to the side of the liquid crystal layer 9 in the counter substrate 4, and causes the liquid crystal molecules of the liquid crystal layer 9 to be aligned. The materials of the second alignment film 44 include polyimide, silicon oxide, and the like, for example.

The sealing member 8 is formed using an adhesive containing various types of curable resins such as epoxy resin, for example. The sealing member 8 is firmly affixed to each of the element substrate 2 and the counter substrate 4. At a part in a peripheral direction of the sealing member 8, an injection port 81 for injecting a liquid crystal material containing liquid crystal molecules into an inside of the sealing member 8 is formed. The injection port 81 is sealed with a sealing material 80 formed using various types of resin materials.

The liquid crystal layer 9 contains liquid crystal molecules having positive or negative dielectric anisotropy. The liquid crystal layer 9 is interposed between the element substrate 2 and the counter substrate 4 such that the liquid crystal molecules are in contact with both the first alignment film 29 and the second alignment film 44. The liquid crystal layer 9 is disposed between the plurality of pixel electrodes 28 and the common electrode 43, and has optical characteristics changing according to an electric field. Specifically, the liquid crystal molecules included in the liquid crystal layer 9 vary in alignment depending on a voltage applied to the liquid crystal layer 9. That is, the liquid crystal layer 9 enables gray scale display by modulating light in accordance with the voltage applied.

As illustrated in FIG. 1, there are arranged, in the element substrate 2, a plurality of scanning line driving circuits 11, a data line driving circuit 12 and a plurality of external terminals 14. The external terminal 14 is coupled with a drawn-out wiring 15 drawn out from each of the scanning line driving circuit 11 and the data line driving circuit 12. Note that the scanning line driving circuit 11 and the data line driving circuit 12 are located outside the sealing member 8, and may also be located inside the sealing member 8.

The electro-optical device 100 includes a displaying region A10 for displaying images, and a peripheral region A20 surrounding the displaying region A10 in a plan view. The displaying region A10 is provided with a plurality of pixels P arrayed in a matrix pattern. One piece of the pixel electrode 28 is disposed for one piece of the pixel P.

1-2. Electrical Configuration

Figure 3:
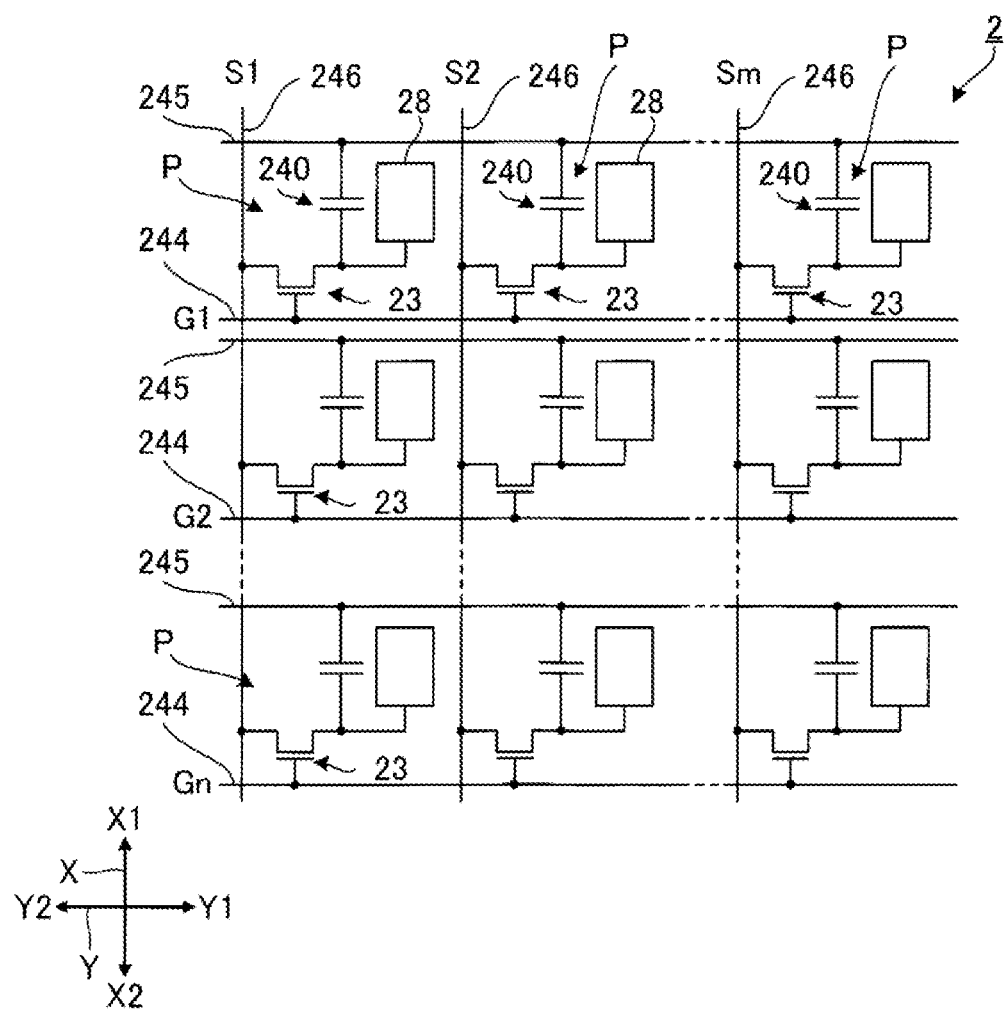
FIG. 3 is an equivalent circuit diagram illustrating an electrical configuration of an element substrate.

FIG. 3 is an equivalent circuit diagram illustrating an electrical configuration of the element substrate 2. As illustrated in FIG. 3, the element substrate 2 is provided with n pieces of scanning lines 244, m pieces of data lines 246, and n pieces of capacitor lines 245. The n and m are each an integer of 2 or greater.

The n pieces of scanning lines 244 each extend along the Y axis and are aligned at equal intervals along the X axis. The scanning line 244 is electrically coupled to a gate of a transistor 23. The n pieces of scanning lines 244 are also electrically coupled to the scanning line driving circuit 11 illustrated in FIG. 1. To the n pieces of scanning lines 244, scanning signals G1, G2, . . . , and Gn are line-sequentially supplied from the scanning line driving circuit 11.

The m pieces of data lines 246 illustrated in FIG. 3 each extend along the X axis and are aligned at equal intervals along the Y axis. The data lines 246 is electrically coupled to a source of the transistor 23. The m pieces of data lines 246 are also electrically coupled to the data line driving circuit 12 illustrated in FIG. 1. To the m pieces of data lines 246, image signals S1, S2, . . . , and Sm are line-sequentially supplied from the data line driving circuit 12.

The n pieces of scanning lines 244 and the m pieces of data lines 246 are insulated from each other and are formed in a lattice-like pattern in a plan view. A region surrounded by two pieces of scanning lines 244 adjacent to each other and two pieces of data lines 246 adjacent to each other corresponds to the pixel P. One piece of the pixel P is provided with one piece of the pixel electrode 28. One piece of the pixel electrode 28 is electrically coupled with one piece of the transistor 23. The transistor 23 serves as a TFT that functions as a switching element, for example.

The n pieces of capacitor lines 245 each extend along the Y axis and are aligned at equal intervals along the X axis. Further, the n pieces of capacitor lines 245 are insulated from both the plurality of the data lines 246 and the plurality of the scanning lines 244, and are formed spaced apart from these lines. A fixed potential such as a ground potential is applied to the capacitor line 245, for example. In addition, a storage capacitor 240 is provided in parallel to a liquid crystal capacitor, between the capacitor line 245 and the pixel electrode 28, to prevent leakage of charges held in the liquid crystal capacitor. The storage capacitor 240 is a capacitor element for holding a potential of the pixel electrode 28 in accordance with an image signal Sm that is supplied.

The scanning signals G1, G2, . . . , and Gn become sequentially active and the n pieces of scanning lines 244 are sequentially selected, then the transistor 23 coupled to the scanning line 244 that is selected is turned to ON-state. Then, the image signals S1, S2, . . . , and Sm having a magnitude commensurate with a grayscale to be displayed are transmitted, via the m pieces of data lines 246, to the pixel P corresponding to the scanning line 244 that is selected, and are then applied to the pixel electrodes 28. This allows a voltage commensurate with the grayscale to be displayed to be applied to the liquid crystal capacitor formed between the pixel electrode 28 and the common electrode 43 included in the counter substrate 4 illustrated in FIG. 2, where the liquid crystal molecules varies in alignment in accordance with the applied voltage. In addition, the voltage applied is held by the storage capacitor 240. Such a variation in alignment of the liquid crystal molecules causes light to be modulated, enabling grayscale display.

1-3. Configuration of Element Substrate 2

Figure 4:
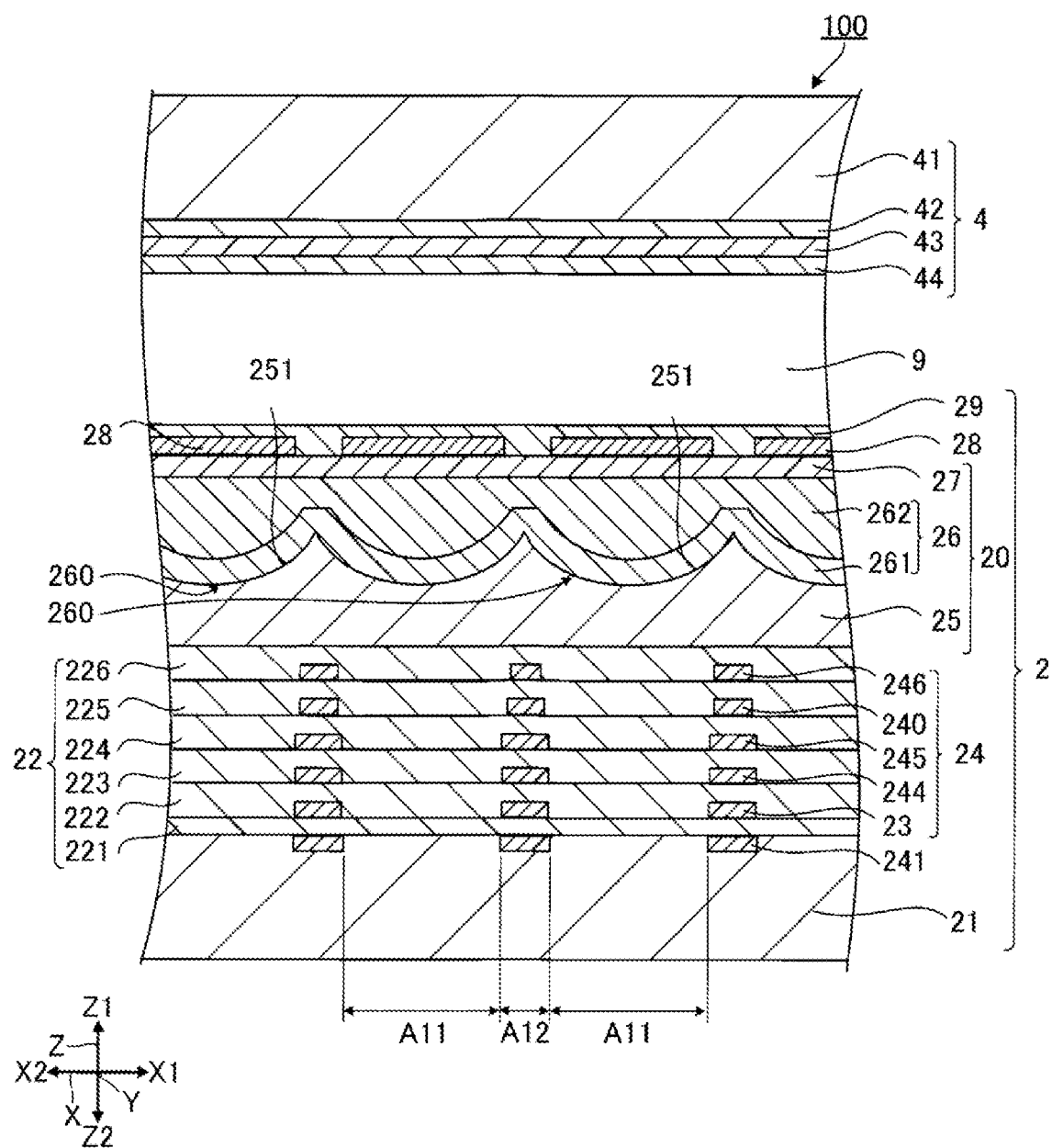
FIG. 4 is a cross-sectional view illustrating a part of an electro-optical device.

FIG. 4 is a cross-sectional view illustrating a part of the electro-optical device 100. The first base body 21 illustrated in FIG. 4 is constituted by a plate having translucency and insulating properties. The first base body 21 is composed of a glass, a quartz, or the like, for example. The first base body 21 is provided with a light-shielding body 241 having light-shielding properties and electrical conductivity. The light-shielding body 241 is provided for each of the transistors 23. Note that the light-shielding body 241 is disposed inside a concave portion provided at the first base body 21. Examples of a constituent materials of the light-shielding body 241 include metal, metal nitride, and metal silicide such as tungsten (W), titanium (Ti), chromium (Cr), iron (Fe), and aluminum (Al), for example. A use of the tungsten among these materials enables the light-shielding body 241 to particularly effectively prevent light from being incident on the transistor 23. The light-shielding body 241 may also be electrically coupled to a gate electrode included in the transistor 23, and may be used as a back gate.

The wiring layer 24 covering the light-shielding body 241 is disposed over the first base body 21. The wiring layer 24 is located between the first base body 21 and the plurality of pixel electrodes 28. The wiring layer 24 includes the transistor 23, the scanning line 244, the capacitor line 245, the storage capacitor 240, and the data line 246. The wiring layer 24 also includes an insulating body 22 having insulating properties and translucency. The insulating body 22 has a configuration in which interlayer insulating films 221, 222, 223, 224, 225, and 226 are layered in this order. The interlayer insulating films 221 to 226 are each constituted by a silicon oxide film formed by, for example, a thermal oxidation method, a CVD method, or the like. A plurality of the transistors 23 and various types of wirings are each arranged as appropriate between the respective layers of the insulating body 22.

The interlayer insulating film 221 is disposed over the first base body 21. The transistor 23 is disposed between the interlayer insulating film 221 and the interlayer insulating film 222. Although not illustrated in detail, the transistor 23 includes a semiconductor layer, a gate electrode, and a gate insulating film. The semiconductor layer has a source region, a drain region, and a channel region. The scanning line 244 is disposed between the interlayer insulating film 222 and the interlayer insulating film 223. The scanning line 244 is electrically coupled to a gate electrode of the transistor 23. The capacitor line 245 is disposed between the interlayer insulating film 223 and the interlayer insulating film 224. The storage capacitor 240 is disposed between the interlayer insulating film 224 and the interlayer insulating film 225. The storage capacitor 240 includes an electrode electrically coupled to, for example, a drain region of the transistor 23, an electrode electrically coupled to the capacitor line 245, and a dielectric layer disposed between these two electrodes. The data line 246 is disposed between the interlayer insulating film 225 and the interlayer insulating film 226. The data line 246 is electrically coupled to a source region of the transistor 23. Note that in FIG. 4, the transistor 23 and the various types of wirings disposed between the respective layers of the insulating body 22 are schematically illustrated. The various types of wirings can be arbitrarily arranged without being limited to the example illustrated in FIG. 4. For example, the storage capacitor 240 may be disposed on the side of the liquid crystal layer 9 from the data line 246.

Each of the electrodes included in the storage capacitor 240 is constituted by a titanium nitride film, for example. Various types of wirings such as the scanning line 244, the capacitor line 245, and the data line 246 are constituted by a layered body of an aluminum film and a titanium nitride film, for example. The inclusion of the aluminum film enables to reduce the resistance compared to a case where the various wrings are constituted by only the titanium nitride film. Note that each of these electrodes or various types of wirings may be composed of materials other than the above-described materials. For example, each of these electrodes or wirings may be composed of a metal, a metal nitride, and a metal silicide such as tungsten, titanium, chromium, iron, and aluminum, for example.

The light-guiding layer 20 is disposed over the wiring layer 24. The light-guiding layer 20 includes an insulating layer 25, a lens layer 26, and a protective layer 27. The insulating layer 25 has translucency and insulating properties. The materials of the insulating layer 25 include an inorganic material containing silicon, such as silicon oxide and silicon oxynitride, for example. A plurality of concave surfaces 251 having a curved shape are provided on a face on an opposite side from the wiring layer 24 of the insulating layer 25. Although not illustrated, the plurality of concave surfaces 251 are arrayed in a matrix pattern in a plan view. One piece of the concave surface 251 corresponds to one piece of the pixel electrode 28. Specifically, one piece of the concave surface 251 overlaps in a plan view with one piece of the pixel electrode 28.

The lens layer 26 is disposed over the insulating layer 25 in a manner filling insides of the plurality of concave surfaces 251. The lens layer 26 has translucency and insulating properties. The lens layer 26 is different in refractive index from the insulating layer 25, and is, in the embodiment, greater in refractive index than the insulating layer 25. The lens layer 26 includes a plurality of lenses 260. The plurality of lenses 260 include a lens surface being a convex surface making contact with the concave surface 251. Thus, although not illustrated, one piece of the lens 260 overlaps in a plan view with one piece of the pixel electrode 28. A refraction of light by the lens surface of the lens 260 thus formed enables to suppress the light from being incident on the transistor 23.

The lens layer 26 includes a first layer 261 and a second layer 262. The first layer 261 is disposed between the insulating layer 25 and the second layer 262 and makes contact with the insulating layer 25 and the second layer 262. The first layer 261 is formed along a shape of the concave surface 251. The second layer 262 is greater in thickness than the first layer 261. The second layer 262 fills a part of a region other than the first layer 261, inside the concave surface 251. In the embodiment, materials of the first layer 261 are identical to the materials of the second layer 262. The materials of the first layer 261 and the materials of the second layer 262 each include an inorganic material containing silicon, such as silicon oxynitride, for example.

The protective layer 27 is disposed between the lens layer 26 and the plurality of pixel electrodes 28. The protective layer 27 is composed of an inorganic material having translucency and hygroscopic properties, such as a Borosilicate Glass (BSG), for example. Note that the protective layer 27 may be omitted. In addition, the plurality of pixel electrodes 28 are disposed over the protective layer 27. The pixel electrode 28 has translucency and is composed of a transparent conductive material such as an ITO or an IZO, for example. The first alignment film 29 is disposed over the plurality of pixel electrodes 28.

The element substrate 2 has a plurality of transmissive regions A11 that allow light to pass through and a wiring region A12 that blocks the light. Although not illustrated, the plurality of transmissive regions A11 are arrayed in a matrix pattern, and each have a substantially quadrangular shape when viewed in a plan view. Each of the transmissive regions A11 is provided with the pixel electrode 28. Although not illustrated, the wiring region A12 has a lattice shape in a plan view, and surrounds the transmissive region A11. The wiring region A12 is provided with the transistor 23, the scanning line 244, the data line 246, and the capacitor line 245.

The element substrate 2 described above includes the insulating layer 25 having translucency and having the concave surface 251, and the lens layer 26 having the lens 260 disposed inside the concave surface 251. The lens layer 26 also includes the first layer 261 and the second layer 262. That is, the lens layer 26 is formed of a plurality of layers. As such, the lens layer 26, which is formed of the plurality of layers, can suppress, during manufacture described later, a warpage of the element substrate 2 occurring when forming a first transmissive layer 261a and the warpage of the element substrate 2 occurring when forming a second transmissive layer 262a. Thus, in the planarization treatment after the formation of the first transmissive layer 261a and in the planarization treatment after the formation of the second transmissive layer 262a, it is possible to avoid an occurrence of transport trouble in the planarization treatment caused by the warpage of the element substrate 2 and failure such as a crack in the element substrate 2 including the lens layer 26 and a lower layer of the lens layer 26.

1-4. Manufacturing Method for Electro-optical Device 100

Figure 5:
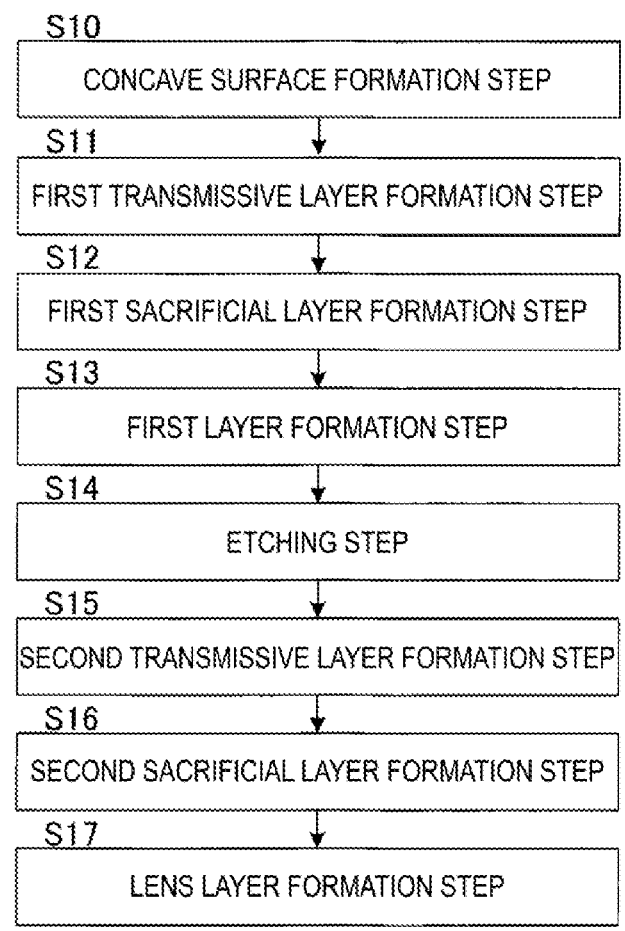
FIG. 5 is a chart of flow of a manufacturing method for an electro-optical device.

FIG. 5 is a chart of flow of a manufacturing method for the electro-optical device 100. In FIG. 5, a manufacturing step of the light-guiding layer 20 is mainly illustrated as a representative in a manufacturing process of the electro-optical device 100. Note that a structure other than the light-guiding layer 20 of the electro-optical device 100 can be manufactured by a publicly known method.

As illustrated in FIG. 5, a manufacturing method for the element substrate 2 includes a concave surface formation step S10, a first transmissive layer formation step S11, a first sacrificial layer formation step S12, a first layer formation step S13, an etching step S14, a second transmissive layer formation step S15, a second sacrificial layer formation step S16, and a lens layer formation step S17. These steps are sequentially described below.

Figure 6:
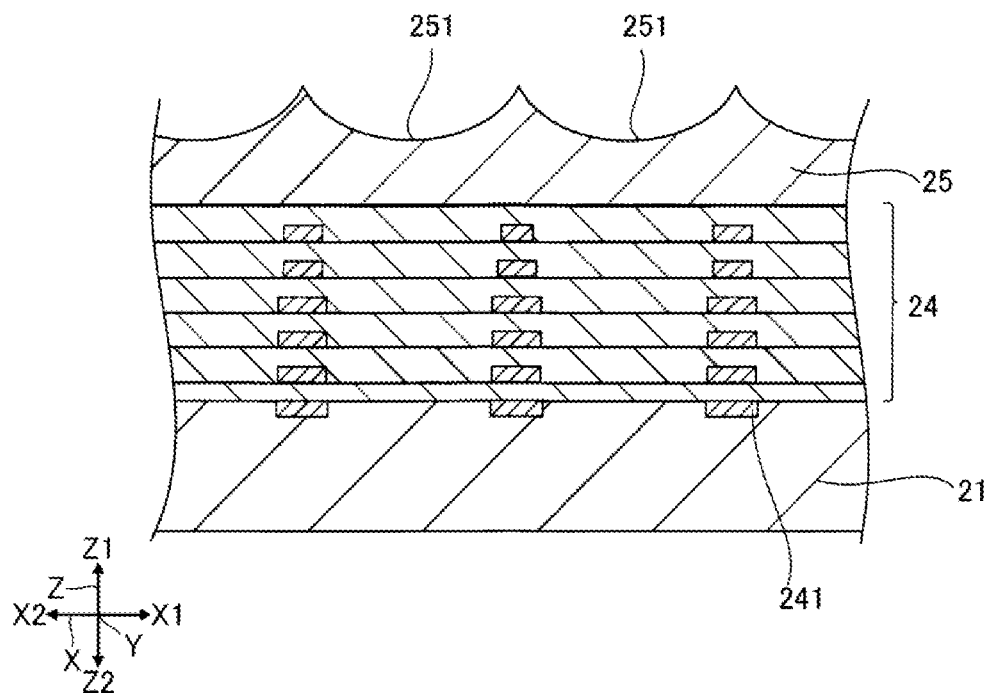
FIG. 6 is a cross-sectional view for explaining a concave surface formation step.

FIG. 6 is a cross-sectional view for explaining the concave surface formation step S10. As illustrated in FIG. 6, in the concave surface formation step S10, the insulating layer 25 having the plurality of concave surfaces 251 is formed. Specifically, an inorganic material film containing silicon such as silicon oxide is firstly formed using a vapor deposition method such as a CVD method, for example. Next, a resist mask having a plurality of openings corresponding to the plurality of concave surfaces 251 is formed over the inorganic material film. Subsequently, a part of the inorganic material film is removed by etching, such as wet etching, using the resist mask. As a result, the insulating layer 25 having the plurality of concave surfaces 251 having a curved shape is formed.

Figure 7:
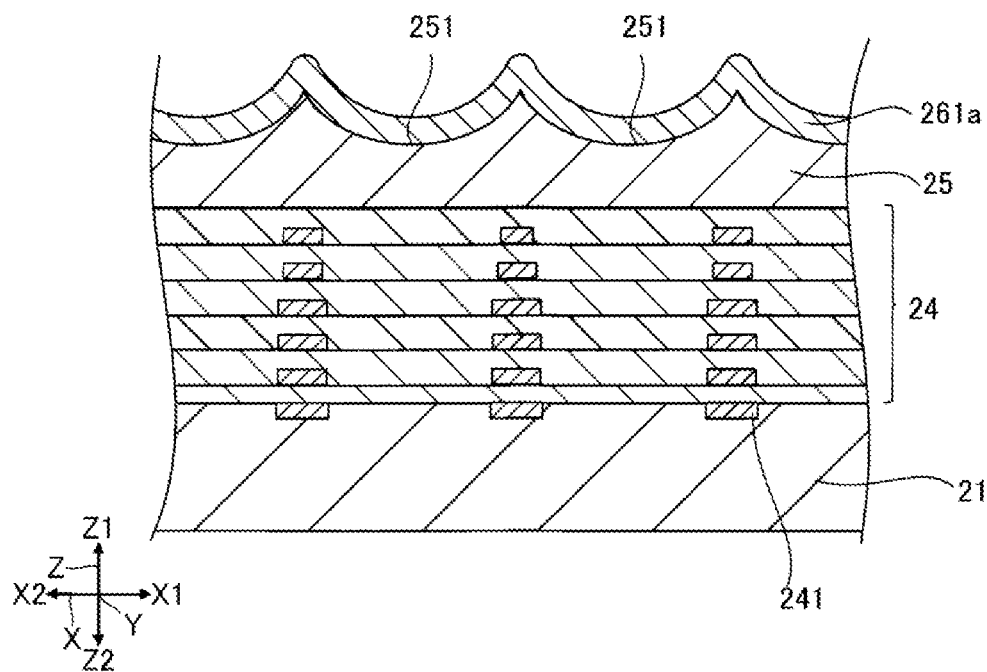
FIG. 7 is a cross-sectional view for explaining a first transmissive layer formation step.

FIG. 7 is a cross-sectional view for explaining the first transmissive layer formation step S11. As illustrated in FIG. 7, in the first transmissive layer formation step S11, the first transmissive layer 261a having translucency is formed over the plurality of concave surfaces 251. The first transmissive layer 261a is formed by a vapor deposition method such as a CVD method. The materials of the first transmissive layer 261a are different from the materials of the insulating layer 25, and in the embodiment, the first transmissive layer 261a is greater in refractive index than the insulating layer 25. The materials of the first transmissive layer 261a include silicon oxynitride, for example.

The first transmissive layer 261a is formed over the concave surface 251 along the shape of the concave surface 251. The first transmissive layer 261a does not fill the entirety of the region inside the concave surface 251. This allows the first transmissive layer 261a to be thinner in thickness than when filling the entirety of the region inside the concave surface 251. This further allows the first transmissive layer 261a, which is thin in thickness, to have a reduced residual stress. This makes it possible to suppress a deformation such as a warpage occurring in the element substrate 2 due to the formation of the first transmissive layer 261a. Then, the suppression of the warpage of the element substrate 2 enables to avoid, in the subsequent planarization treatment, the occurrence of transport trouble in the planarization treatment caused by the warpage of the element substrate 2 and failure such as the crack in the element substrate 2 including the lens layer 26 and the lower layer of the lens layer 26.

Figure 8:
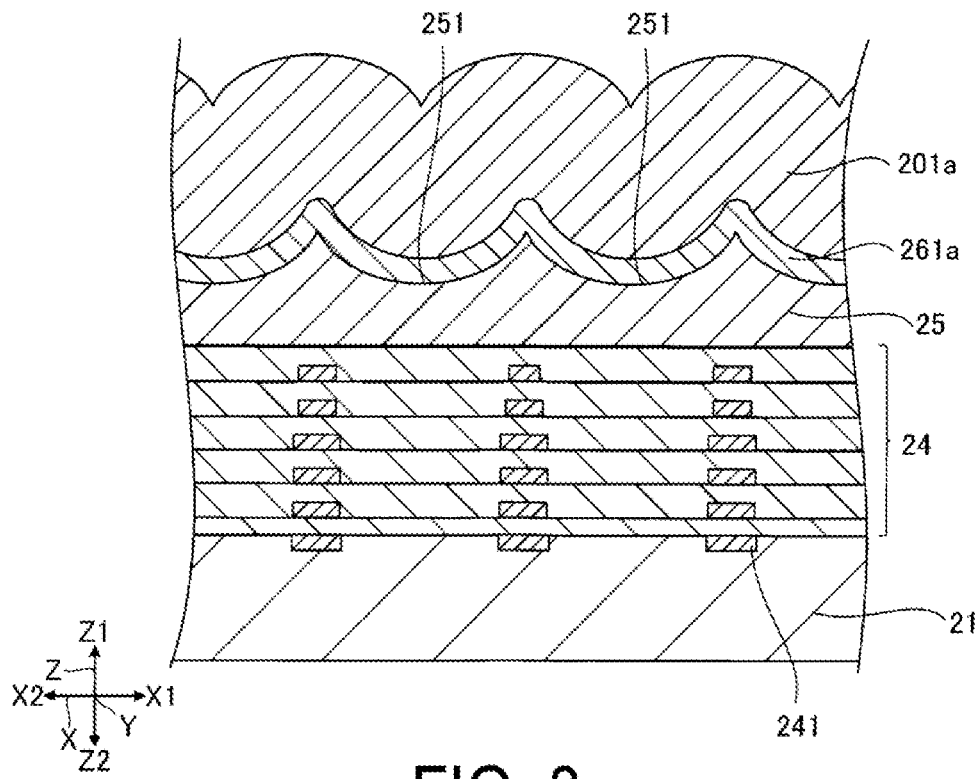
FIG. 8 is a cross-sectional view for explaining a first sacrificial layer formation step.

FIG. 8 is a cross-sectional view for explaining the first sacrificial layer formation step S12. As illustrated in FIG. 8, in the first sacrificial layer formation step S12, a first sacrificial layer 201a is formed over the plurality of concave surfaces 251. The first sacrificial layer 201a makes contact with the first transmissive layer 261a. The first sacrificial layer 201a fills the part of the region other than the first transmissive layer 261a, inside the concave surface 251.

The materials of the first sacrificial layer 201a differ from the materials of the first transmissive layer 261a. The materials of the first sacrificial layer 201a include an inorganic material containing oxygen and silicon, for example. Specifically, the materials of the first sacrificial layer 201a include silicon dioxide, Borosilicate Glass (BSG), and Borophospho silicate glass (BPSG), for example. In particular, the materials of the first transmissive layer 261a including silicon oxynitride and the materials of the first sacrificial layer 201a including silicon dioxide, BSG, or BPSG enable the first sacrificial layer 201a to be lower in residual stress than the first transmissive layer 261a. In other words, it is preferred that the first sacrificial layer 201a be composed of materials that are lower in residual stress than the first transmissive layer 261a. A use of the first sacrificial layer 201a thus composed enables to suppress the warpage occurring in the element substrate 2 due to the formation of the first sacrificial layer 201a. This makes it possible to avoid, in the subsequent steps, the occurrence of transport trouble in the planarization treatment caused by the warpage of the element substrate 2 and failure such as the crack in the element substrate 2.

A use of the first sacrificial layer 201a enables the thickness of the first transmissive layer 261a to be thinner than when the first sacrificial layer 201a is not used, to thus suppress the warpage occurring in the element substrate 2 when the first sacrificial layer 201a is formed. Thus, when polishing the first transmissive layer 261a and the like in the steps that will be described later, it is possible to resolve an occurrence of transport failure inside a polisher caused by the warpage of the element substrate 2 and failure such as the crack in the element substrate 2 including the lens layer 26 and the lower layer of the lens layer 26.

The first sacrificial layer 201a is formed by a vapor deposition method such as a CVD method, for example. The use of the CVD method enables to rapidly form the first sacrificial layer 201a composed of an inorganic material. In particular, it is preferred that the first sacrificial layer 201a be formed by a high density plasma CVD method. The high density plasma CVD method has a sputtering effect (scraping a surface of the first transmissive layer 261a with Ar ions) at the time of deposition. The sputtering effect allows to form the first sacrificial layer 201a while removing irregularities in the surface of the first transmissive layer 261a. This makes it possible to achieve smoothing of the surface of the first sacrificial layer 201a. This allows for a reduction of a required amount of polishing when polishing the first transmissive layer 261a as the planarization treatment.

Figure 9:
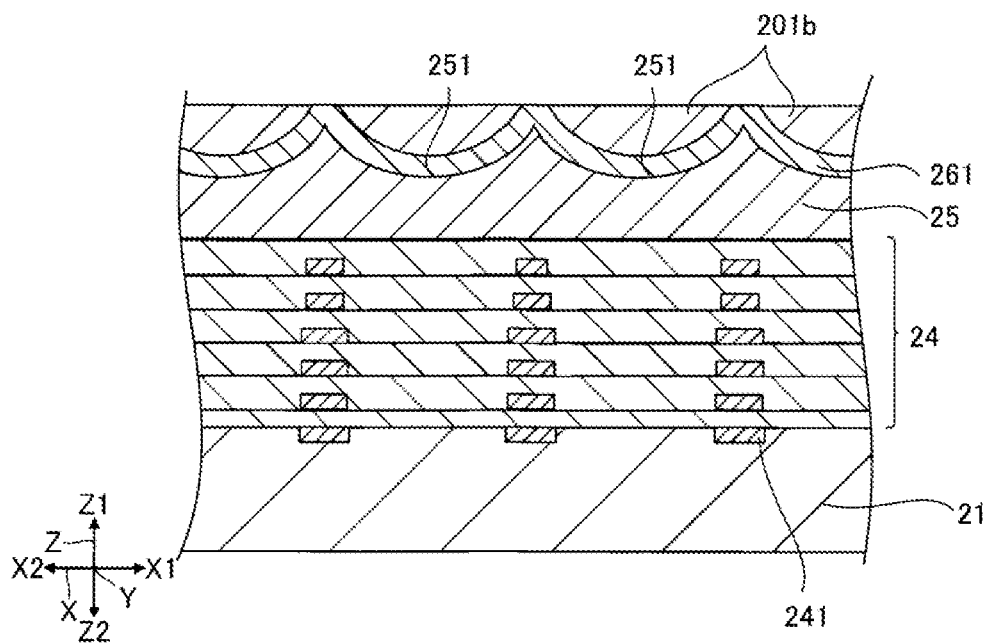
FIG. 9 is a cross-sectional view for explaining a first layer formation step.

FIG. 9 is a cross-sectional view for explaining the first layer formation step S13. As illustrated in FIG. 9, in the first layer formation step S13, the first layer 261 is formed from the first transmissive layer 261a, and a sacrificial layer residual portion 201b is formed from the first sacrificial layer 201a. Specifically, the first transmissive layer 261a and the first sacrificial layer 201a illustrated in FIG. 8 are polished by a CMP or the like. The first sacrificial layer 201a is polished to form the sacrificial layer residual portion 201b being a residual portion of the first sacrificial layer 201a, and the first transmissive layer 261a is polished to form the first layer 261 being a residual portion of the first transmissive layer 261a. The first sacrificial layer 201a is further polished to allow the sacrificial layer residual portion 201b to be planarized. In the first layer formation step S13, an amount of polishing of the first transmissive layer 261a is less than the amount of polishing of the first sacrificial layer 201a.

Figure 10:
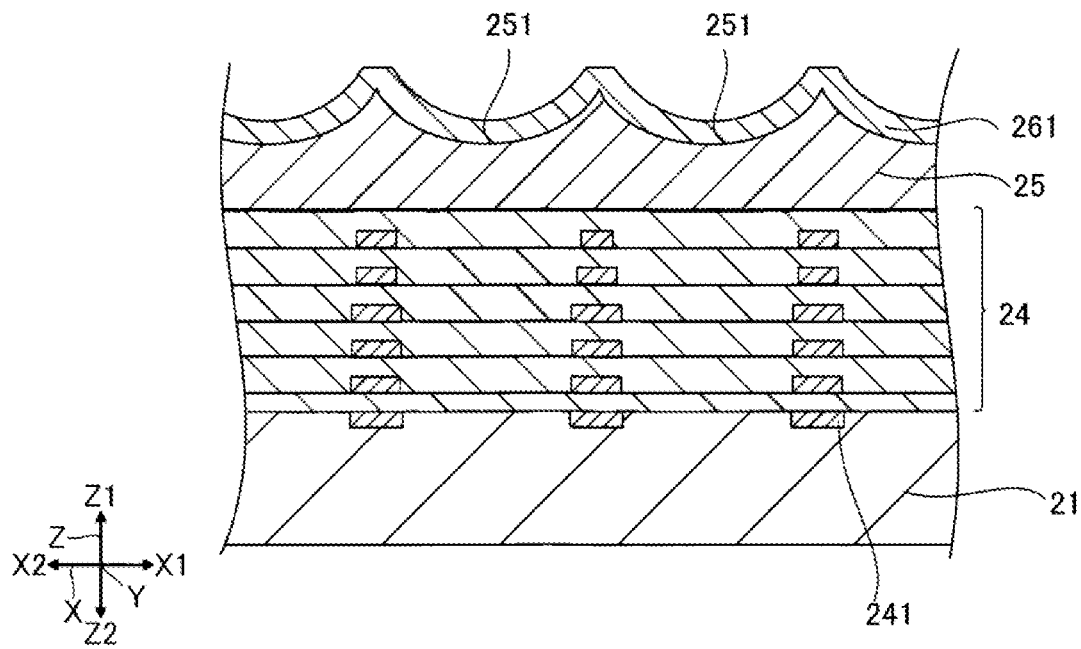
FIG. 10 is a cross-sectional view for explaining an etching step.

FIG. 10 is a cross-sectional view for explaining the etching step S14. As illustrated in FIG. 10, in the etching step S14, the sacrificial layer residual portion 201b illustrated in FIG. 9 is removed by etching. It is preferred that the etching be wet etching. That is, it is preferred that the sacrificial layer residual portion 201b be removed by wet etching. The use of the wet etching has an advantage in that the first sacrificial layer 201a is selectively easily removed due to the fact that a selected ratio of different films is easily obtained compared to when using a dry etching. When the first sacrificial layer 201a contains an inorganic material containing oxygen and silicon, in the wet etching, a fluorine-based etchant such as a buffered hydrofluoric acid (BHF) or a dilute hydrofluoric acid (DHF) is used.

The sacrificial layer residual portion 201b in the wet etching is greater in etching rate than the first layer 261 in the wet etching. That is, the first sacrificial layer 201a is formed of materials that are greater in etching rate in the wet etching than the material of the first transmissive layer 261a. Note that a density of the first transmissive layer 261a or a density of the first sacrificial layer 201a may be adjusted such that the first sacrificial layer 201a is greater in etching rate than the first transmissive layer 261a. The sacrificial layer residual portion 201b can be selectively and easily removed in the etching step S14 due to the fact that the sacrificial layer residual portion 201b is greater in etching rate than the first layer 261.

Figure 11:
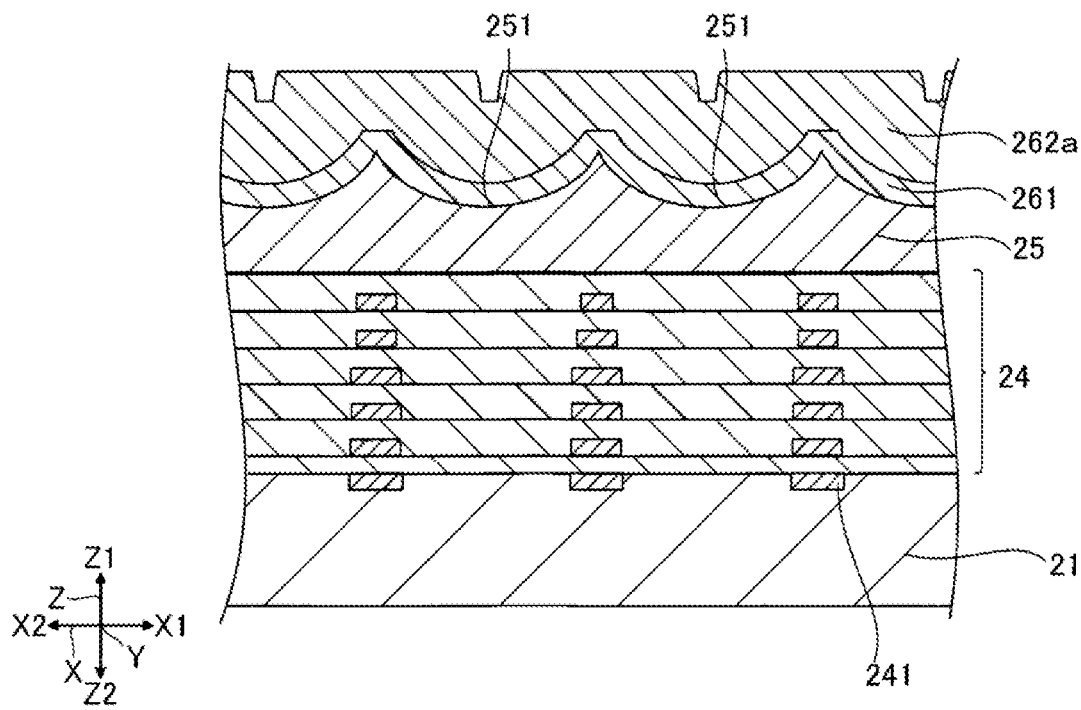
FIG. 11 is a cross-sectional view for explaining a second transmissive layer formation step.

FIG. 11 is a cross-sectional view for explaining the second transmissive layer formation step S15. In the second transmissive layer formation step S15, the second transmissive layer 262a making contact with the first layer 261 is formed over the first layer 261. The second transmissive layer 262a is formed in a manner filling the part of the region other than the first layer 261, inside the concave surface 251. As described above, the second transmissive layer 262a is formed by a vapor deposition method such as a CVD method, for example.

The region inside the concave surface 251, which is filled with the first layer 261 and the second transmissive layer 262a, enables the second transmissive layer 262a to be thinned in thickness compared to a case where the second transmissive layer 262a is only used to fill the region inside the concave surface 251. This makes it possible to suppress the warpage occurring in the element substrate 2 due to the formation of the second transmissive layer 262a. This makes it possible to avoid, in the subsequent steps, the occurrence of transport trouble in the planarization treatment caused by the warpage of the element substrate 2 and failure such as the crack in the element substrate 2 including the lens layer 26 and the lower layer of the lens layer 26.

The materials of the second transmissive layer 262a include silicon oxynitride, for example. The materials of the second transmissive layer 262a include materials that are identical to those of the first transmissive layer 261a. The materials being identical eventually result in a formation of the lens layer 26 of a homogeneous quality. When the first transmissive layer 261a and the second transmissive layer 262a are composed of mutually different materials, an unnecessary interfacial reflection is likely to occur at an interface between the first transmissive layer 261a and the second transmissive layer 262a. However, the first transmissive layer 261a and the second transmissive layer 262a including the same materials enable to prevent the occurrence of the interfacial reflection.

Further, it is preferred that the materials of the first transmissive layer 261a and the materials of the second transmissive layer 262a that are described above each include silicon oxynitride. The materials including the silicon oxynitride enable to properly form the first transmissive layer 261a and the second transmissive layer 262a by a CVD method. In addition, when the insulating layer 25 contains the silicon oxide, the materials of each of the first transmissive layer 261a and the second transmissive layer 262a including the silicon oxynitride enable to form the lens layer 26 that is higher in refractive index than the insulating layer 25.

Figure 12:
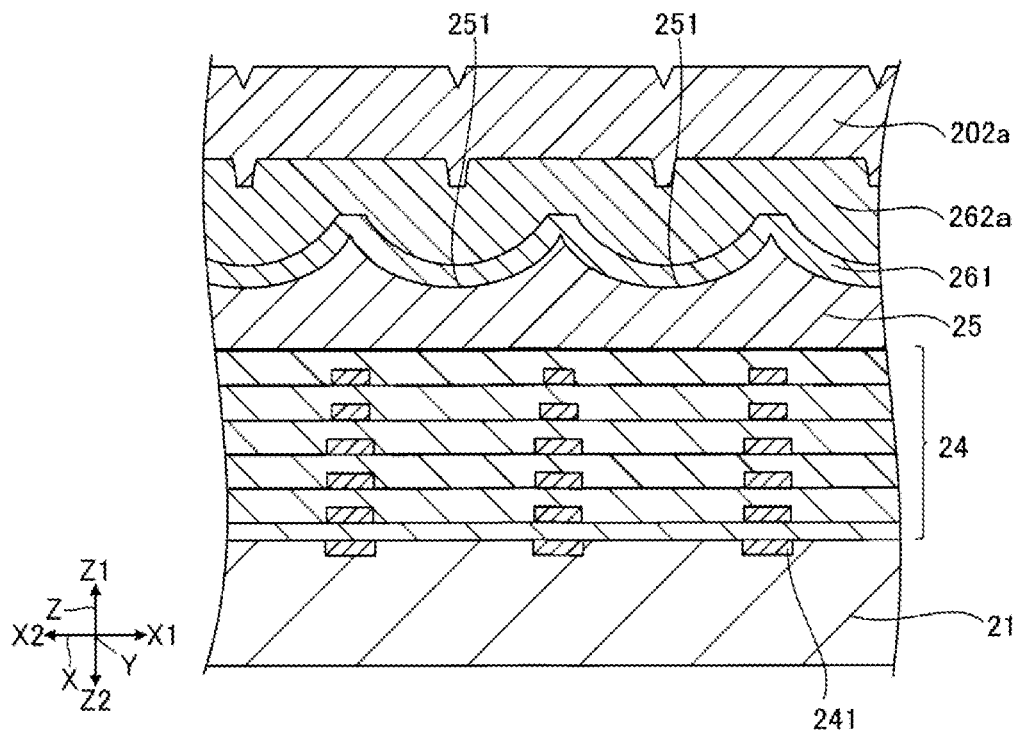
FIG. 12 is a cross-sectional view for explaining a second sacrificial layer formation step.

FIG. 12 is a cross-sectional view for explaining the second sacrificial layer formation step S16. As illustrated in FIG. 12, in the second sacrificial layer formation step S16, a second sacrificial layer 202a is formed over the second transmissive layer 262a. The second sacrificial layer 202a makes contact with the second transmissive layer 262a.

The materials of the second sacrificial layer 202a differ from the materials of the second transmissive layer 262a. Note that the materials of the second sacrificial layer 202a are identical to those of the first sacrificial layer 201a, and may be different from those of the first sacrificial layer 201a. The materials of the second sacrificial layer 202a include an inorganic material containing oxygen and silicon, for example. Specifically, the materials of the second sacrificial layer 202a include silicon dioxide, BSG, BPSG, and the like, for example. In particular, the materials of the second transmissive layer 262a including silicon oxynitride and the materials of the second sacrificial layer 202a including silicon dioxide, BSG, or BPSG enable the second sacrificial layer 202a to be lower in residual stress than the second transmissive layer 262a. In other words, it is preferred that the second sacrificial layer 202a be composed of materials that are lower in residual stress than the second transmissive layer 262a. A use of the second sacrificial layer 202a thus composed enables to suppress the warpage occurring in the element substrate 2 due to the formation of the second sacrificial layer 202a. This makes it possible to avoid, in the subsequent steps, the occurrence of transport trouble in the planarization treatment caused by the warpage of the element substrate 2 and failure such as the crack in the element substrate 2 including the lens layer 26 and the lower layer of the lens layer 26.

A use of the second sacrificial layer 202a enables the second transmissive layer 262a to be thinner in thickness than when the second sacrificial layer 202a is not used. This allows for a reduction of the amount of polishing of the second transmissive layer 262a in the steps that will be described later. This makes it possible to minimize a stress exerted on the second transmissive layer 262a when performing polishing in the steps that will be described later. In addition, the second transmissive layer 262a can be thinned in thickness, to thus minimize the residual stress in the second transmissive layer 262a. This makes it possible to suppress the warpage occurring in the element substrate 2 due to the formation of the second transmissive layer 262a.

The second sacrificial layer 202a is formed by a vapor deposition method such as a CVD method, for example. In particular, it is preferred that the second sacrificial layer 202a be formed by a high density plasma CVD method. As described above, the high density plasma CVD method has a sputtering effect (impinging upon and scraping the second transmissive layer 262a with Ar ions) at the time of deposition. The sputtering effect, which allows a deposition to take place while scraping convex portions that the Ar ions readily reach, enables to form the second sacrificial layer 202a while removing irregularities in a surface of the second transmissive layer 262a. This makes it possible to achieve smoothing of a surface of the second sacrificial layer 202a. This allows for a reduction of a required amount of polishing when polishing the second transmissive layer 262a as the planarization treatment.

Figure 13:
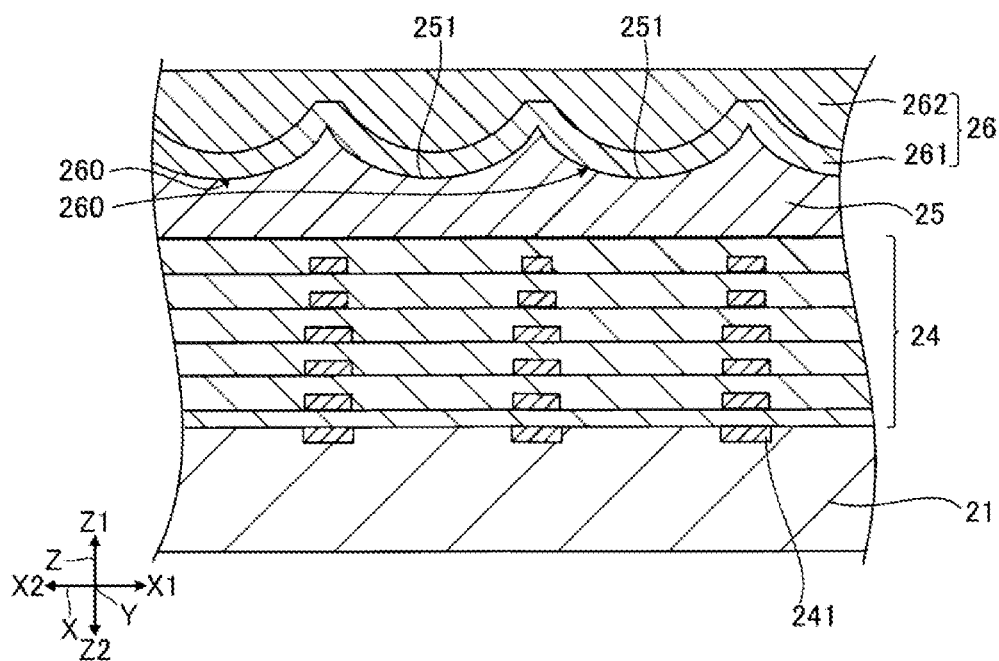
FIG. 13 is a cross-sectional view for explaining a lens layer formation step.

FIG. 13 is a cross-sectional view for explaining the lens layer formation step S17. As illustrated in FIG. 13, in the lens layer formation step S17, the lens layer 26 including the first layer 261 and the second layer 262 is formed. Specifically, the second transmissive layer 262a and the second sacrificial layer 202a that are illustrated in FIG. 12 are polished by a CMP or the like. The second sacrificial layer 202a is removed by being polished. The second transmissive layer 262a is polished to make the surface of the second transmissive layer 262a planarized, and to form the second layer 262 being a residual portion of the second transmissive layer 262a. The second layer 262 is formed to make form the lens layer 26 including the first layer 261 and the second layer 262.

As described above, the manufacturing method for the element substrate 2 includes the first transmissive layer formation step S11, the first sacrificial layer formation step S12, the first layer formation step S13, the etching step S14, the second transmissive layer formation step S15, the second sacrificial layer formation step S16, and the lens layer formation step S17. That is, in the manufacturing method for the element substrate 2, the formation of the transmissive layer, the formation of the sacrificial layer, and the polishing of the sacrificial layer are repetitively performed to form the lens layer 26. According to such a manufacturing method for the element substrate 2, the warpage occurring in the element substrate 2 when the lens layer 26 is formed can be suppressed compared to a case where the lens layer 26 is formed without using the sacrificial layer. Because the warpage of the element substrate 2 is thus suppressed when polishing the lens layer 26, it is possible to resolve the occurrence of transport failure inside the polisher caused by the warpage of the element substrate 2 and failure such as the crack in the element substrate 2 including the lens layer 26 and the lower layer of the lens layer 26.

Further, the lens layer 26 is disposed between the wiring layer 24 including various types of wirings and the plurality of pixel electrodes 28. In general, an annealing temperature for removing the residual stress in the lens layer 26 is set higher than a heat resistance limit temperature, which is a temperature at which physical properties of the wiring included in the wiring layer 24 come to vary. Accordingly, the lens layer 26 to be formed over the wiring layer 24 is formed by the above-described methods, to thus omit performing the annealing process. This makes it possible to reduce a possibility of damage occurring to the various types of wirings included in the wiring layer 24.

2. Modified Example

The embodiments exemplified above can be variously modified. Specific modified aspects applicable to the embodiments described above are exemplified below. Two or more aspects arbitrarily selected from exemplifications below can be appropriately used in combination as long as mutual contradiction does not arise.

Figure 14:
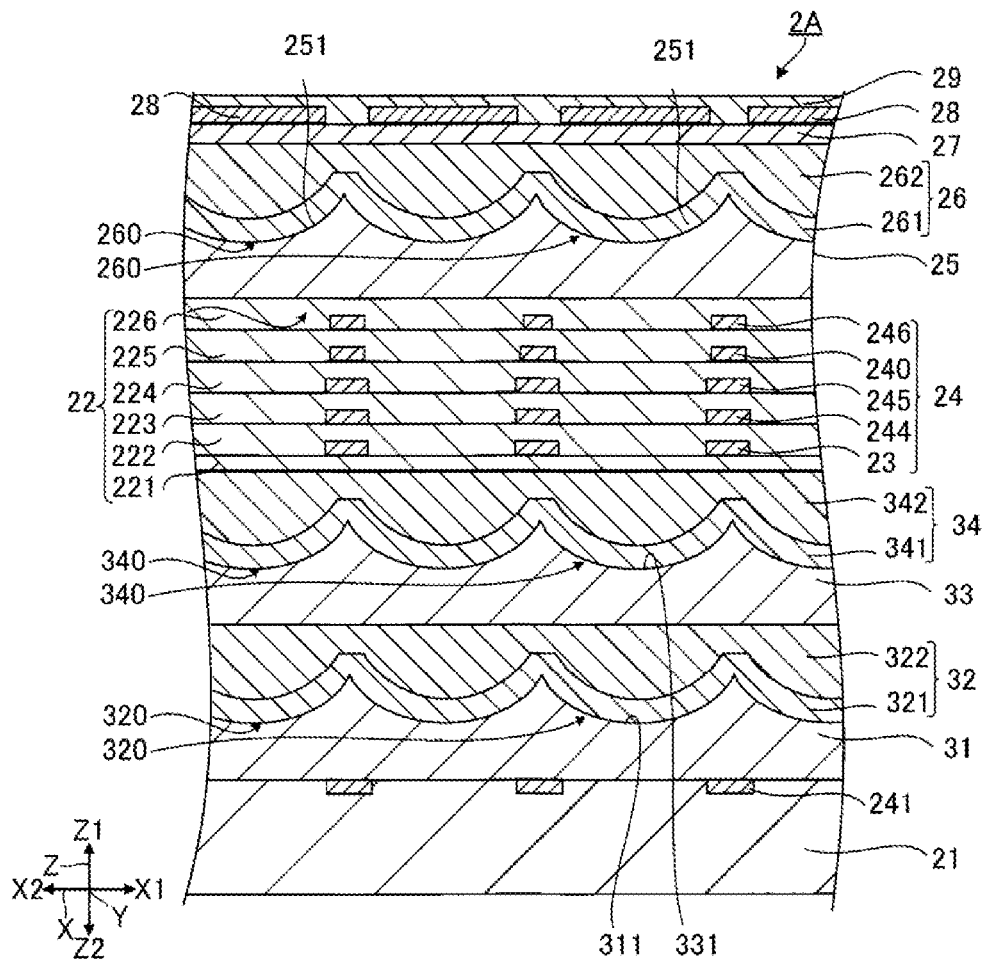
FIG. 14 is a cross-sectional view illustrating, in a partially enlarged manner, a part of an element substrate in a modified example.

In the embodiments described above, the lens layer 26 is disposed over the wiring layer 24, and the "lens layer" may be disposed at a lower layer of the wiring layer 24. FIG. 14 is an enlarged cross-sectional view of a part of an element substrate 2a in the modified example. As illustrated in FIG. 14, the element substrate 2a includes a lens layer 32 and a lens layer 34 at the lower layer of the wiring layer 24.

Specifically, between the first base body 21 and the wiring layer 24, an insulating layer 31, the lens layer 32, an insulating layer 33, and the lens layer 34 are provided in this order. The insulating layers 31 and 33 are each composed of, for example, an inorganic material containing oxygen and silicon, and the lens layers 32 and 34 are each composed of, for example, a silicon oxynitride. The lens layer 32 includes a plurality of lenses 320. Each of the plurality of lenses 320 includes a lens surface making contact with a concave surface 311 of the insulating layer 31. The lens layer 32 includes a first layer 321 and a second layer 322. The first layer 321 is located between the insulating layer 31 and the second layer 322. The lens layer 34 also includes a plurality of lenses 340. Each of the plurality of lenses 340 includes a lens surface making contact with a concave surface 331 of the insulating layer 33. The lens layer 34 includes a first layer 341 and a second layer 342. The first layer 341 is located between the insulating layer 33 and the second layer 342. In the manufactures of the lens layers 32 and 34 thus formed, the formation of the transmissive layer, the formation of the sacrificial layer, and the polishing of the sacrificial layer are repetitively performed in the same manner as in the manufacture of the lens layer 26 in the embodiments described above. This makes it possible to suppress the warpage of the element substrate 2a when the first layer 321 is formed, the warpage of the element substrate 2a when the second layer 322 is formed, the warpage of the element substrate 2a when the first layer 341 is formed, and the warpage of the element substrate 2a when the second layer 342 is formed. Thus, in the polishing steps included in the formation steps of the first layer 321, the second layer 322, the first layer 341, and the second layer 342, it is possible to resolve the occurrence of transport failure inside the polisher caused by the warpage of the element substrate 2a and failure such as the crack in the element substrate 2a including the lens layers 32 and 34 and the lower layers of the lens layers 32 and 34.

In the embodiments described above, the lens layer 26 is provided at the element substrate 2, and a "lens layer" may be provided at the counter substrate 4. That is, it is suffices that the "lens layer" be provided at one or both of the element substrate 2 or the counter substrate 4.

Figure 15:
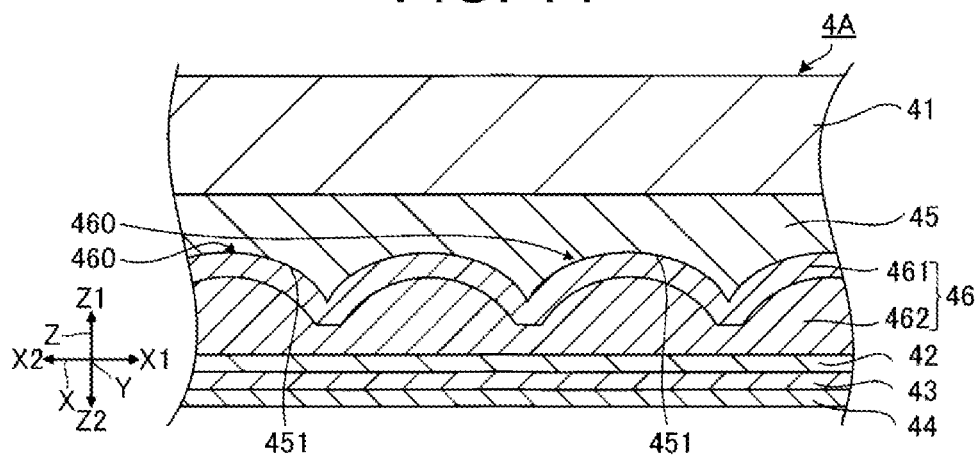
FIG. 15 is a cross-sectional view illustrating, in a partially enlarged manner, a part of a counter substrate in a modified example.

FIG. 15 is a cross-sectional view illustrating, in a partially enlarged manner, a part of a counter substrate 4A in the modified example. As illustrated in FIG. 15, the counter substrate 4A includes a lens layer 46. Specifically, between the second base body 41 and the insulating film 42, an insulating layer 45 and the lens layer 46 are arranged. The insulating layer 45 is composed of, for example, an inorganic material containing oxygen and silicon, and the lens layer 46 is composed of, for example, a silicon oxynitride. The lens layer 46 includes a plurality of lenses 460. Each of the plurality of lenses 460 includes a lens surface making contact with a concave surface 451 of the insulating layer 45. The lens layer 46 includes a first layer 461 and a second layer 462. The first layer 461 is located between the insulating layer 45 and the second layer 462. In a manufacturing method for the counter substrate 4A including the lens layer 46 thus formed, the formation of the transmissive layer, the formation of the sacrificial layer, and the polishing of the sacrificial layer are repetitively performed as in the manufacturing method for the element substrate 2 according to the embodiments described above. This makes it possible to suppress a warpage of the counter substrate 4A when the first layer 461 is formed and the warpage of the counter substrate 4A when the second layer 462 is formed. Thus, in the polishing steps included in the formation steps of the first layer 461 and the second layer 462, it is possible to resolve the occurrence of transport failure inside the polisher caused by the warpage of the counter substrate 4A and failure such as the crack in the counter substrate 4A including the lens layer 46 and the lower layer of the lens layer 46. Note that the "lens layer" may be formed between the layers of the counter substrate 4A in addition to between the second base body 41 and the insulating film 42.

In the embodiments described above, the lens layer 26 includes the first layer 261 and the second layer 262, and a third layer may be provided between the first layer 261 and the second layer 262. That is, the lens layer 26 may be constituted by three or more layers. Further, in the embodiments described above, the materials of the first transmissive layer 261a are identical to the materials of the second transmissive layer 262a, and these materials may be different from each other. In addition, in the embodiments described above, the refractive index of the lens layer 26 is higher than the refractive index of the insulating layer 25, and the former may be lower than the latter.

In the embodiments described above, the cases where the transistor 23 serves as a TFT are described as examples, and the transistor 23 may also be, for example, a metal-oxidesemiconductor field-effect transistor (MOSFET) or the like, without being limited to the TFT.

In the embodiments described above, the electro-optical device 100 of an active matrix driving scheme is exemplified, and the driving scheme of the electro-optical device may be, for example, a passive matrix driving scheme or the like, without being limited to the active matrix driving scheme.

3. Electronic Apparatus

The electro-optical device 100 can be used for various types of electronic apparatuses.

Figure 16:
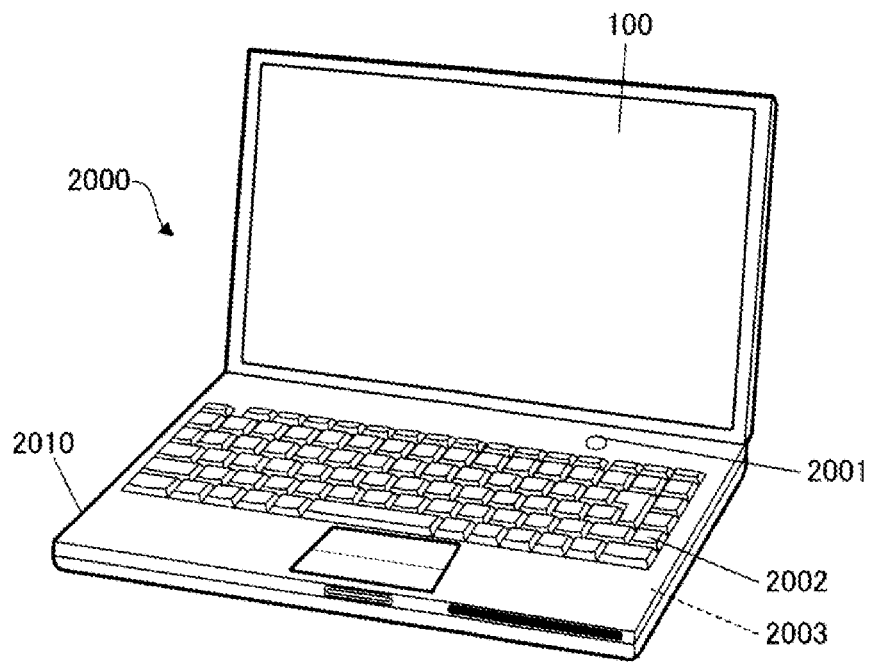
FIG. 16 is a schematic view illustrating a projector being an example of an electronic apparatus.

FIG. 16 is a perspective view illustrating a personal computer 2000 being an example of an electronic apparatus. The personal computer 2000 includes the electro-optical device 100 configured to display various types of images, and a main body portion 2010 in which a power source switch 2001, a keyboard 2002 are installed, and a control unit 2003. The control unit 2003 includes a processor and a memory, for example, and controls operation of the electro-optical device 100.

Figure 17:
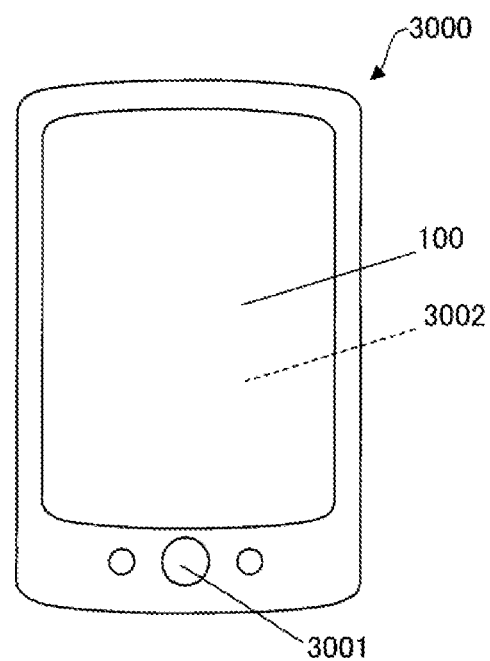
FIG. 17 is a perspective view illustrating a personal computer being an example of an electronic apparatus.

FIG. 17 is a plan view illustrating a smartphone 3000 being an example of the electronic apparatus. The smartphone 3000 includes operation button 3001, the electro-optical device 100 configured to display various types of images, and a control unit 3002. A screen content displayed on the electro-optical device 100 is changed in accordance with operation of the operation button 3001. The control unit 3002 includes a processor and a memory, for example, and controls the operation of the electro-optical device 100.

Figure 18:
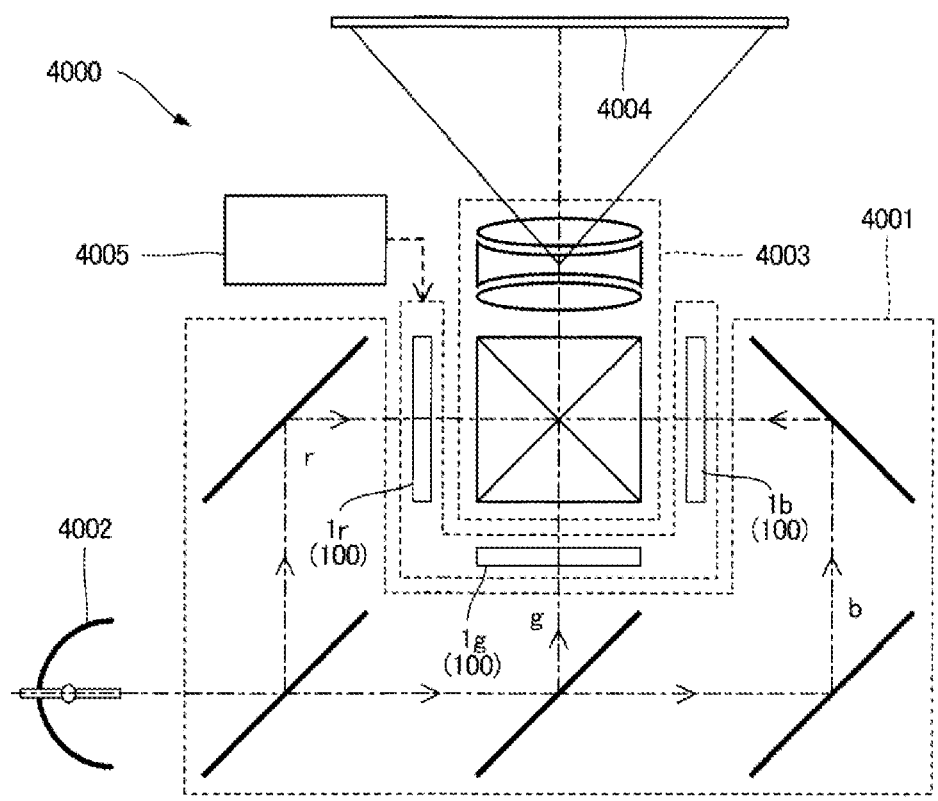
FIG. 18 is a plan view illustrating a smartphone being an example of an electronic apparatus.

FIG. 18 is a schematic view illustrating a projector being an example of the electronic apparatus. A projection-type display apparatus 4000 serves as a three-plate type projector, for example. An electro-optical device 1*r* serves as the electro-optical device 100 corresponding to a red display color, an electro-optical device 1*g* serves as the electro-optical device 100 corresponding to a green display color, and an electro-optical device 1*b* serves as the electro-optical device 100 corresponding to a blue display color. That is, the projection-type display apparatus 4000 includes three pieces of the electro-optical devices 1*r*, 1*g*, and 1*b* that correspond to red, green, and blue display colors, respectively. A control unit 4005 includes a processor and a memory, for example, and controls the operation of the electro-optical device 100.

An illumination optical system 4001 is configured to supply a red constituent r of light emitted from an illumination device 4002 serving as a light source to the electro-optical device 1*r*, a green constituent g of the light to the electro-optical device 1*g*, and a blue constituent b of the light to the electro-optical device 1*b*. Each of the electro-optical devices 1*r*, 1*g*, and 1*b* functions as an optical modulator, such as a light valve, which is configured to modulate respective beams of monochromatic light supplied from the illumination optical system 4001 in accordance with the images that are displayed. A projection optical system 4003 synthesizes the beams of the light emitted from the electro-optical devices 1*r*, 1*g*, and 1*b* to project the synthesized light to a projection surface 4004.

The above electronic apparatuses include the electro-optical device 100 described above and the control unit 2003, 3002, or 4005. The electro-optical device 100, which can reduce the warpage of each of the substrates during the manufacture as described above, has high reliability. This makes it possible to enhance a display quality of the personal computer 2000, the smartphone 3000, or the projection-type display apparatus 4000.

Note that examples of the electronic apparatus to which the electro-optical device of the present disclosure is applied include Personal Digital Assistants (PDA), digital still cameras, televisions, video cameras, car navigation devices, display apparatuses for in-vehicle use, electronic organizers, electronic papers, electronic calculators, word processors, workstations, visual telephones, Point of Scale (POS) terminals, without being limited to the apparatuses described above. Examples of the apparatus to which the present disclosure is applied further include an apparatus provided with a printer, a scanner, a copier, a video player, or a touch panel.

The present disclosure have been described as above based on the preferred embodiments, however, the present disclosure is not limited to the embodiments described above. Further, the configurations of the respective components of the present disclosure may be replaced with any configuration that exerts functions equivalent to those of the embodiments described above, and to which any configuration may be added.

In addition, in the description given above, the liquid crystal device is described as an example of the electro-optical device of the present disclosure, however, the electro-optical device of the present disclosure is not limited to the liquid crystal device. For example, the electro-optical device of the present disclosure can also be applied to an image sensor or the like. For example, the present disclosure is also applicable to a display panel using a light-emitting device such as organic electroluminescent (EL) device, inorganic EL device, or light-emitting polymer, as in the embodiments described above. Further, the present disclosure is also applicable to an electrophoretic display panel using micro capsules each including colored liquid and white particles dispersed in the liquid, as in the embodiments described above.

What is claimed is:

1. A manufacturing method of a lens layer for an electro-optical device, the lens layer including a first layer and a second layer, the manufacturing method of the lens layer comprising, forming a concave portion in an insulating layer over a substrate of the electro-optical device;

forming a first transmissive layer at a concave surface of the concave portion, the insulating layer having translucency;

forming, with a material different from a material of the first transmissive layer, a first sacrificial layer on the first transmissive layer;

polishing the first transmissive layer to form a first layer being a residual portion of the first transmissive layer in the concave portion and polishing the first sacrificial layer to form a sacrificial layer residual portion being a residual portion of the first sacrificial layer in the concave portion;

removing the sacrificial layer residual portion by etching;

forming a second transmissive layer having translucency directly on the first layer;

forming, with a material different from a material of the second transmissive layer, a second sacrificial layer on the second transmissive layer; and polishing the second transmissive layer and the second sacrificial layer to form a second layer from the second transmissive layer.

2. The manufacturing method for the electro-optical device according to claim 1, wherein a material of the first layer is identical to a material of the second layer.

3. The manufacturing method for the electro-optical device according to claim 1, wherein
the first sacrificial layer and the second sacrificial layer are each formed by a high density plasma CVD method.

4. The manufacturing method for the electro-optical device according to claim 1, wherein
the sacrificial layer residual portion is removed by wet etching.

5. The manufacturing method for the electro-optical device according to claim 4, wherein
an etching rate of the first sacrificial layer in the wet etching is greater than an etching rate of the first transmissive layer in a wet etching.

6. The manufacturing method for the electro-optical device according to claim 1, wherein
a material of the first layer and a material of the second layer each include silicon oxynitride.

7. The manufacturing method for the electro-optical device according to claim 1, wherein
a material of the first sacrificial layer and a material of the second sacrificial layer each include an inorganic material containing oxygen and silicon.

* * * * *